(12) United States Patent  
Lopatin

(10) Patent No.: US 6,482,656 B1
(45) Date of Patent: Nov. 19, 2002

(54) METHOD OF ELECTROCHEMICAL FORMATION OF HIGH $T_C$ SUPERCONDUCTING DAMASCENE INTERCONNECT FOR INTEGRATED CIRCUIT

(75) Inventor: Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/873,667

(22) Filed: Jun. 4, 2001

(51) Int. Cl.⁷ .............................................. H01L 21/00
(52) U.S. Cl. ......................... 438/2; 505/202; 505/742; 438/637
(58) Field of Search .......................... 438/2, 618, 622, 438/637, 638, 648, 650; 505/191, 220, 235, 330, 742, 785, 779

(56) References Cited

U.S. PATENT DOCUMENTS

| | | | |
|---|---|---|---|
| 5,183,800 A | * 2/1993 | Nakagawa | 505/1 |
| 5,439,780 A | 8/1995 | Joshi et al. | 430/296 |
| 5,593,918 A | 1/1997 | Rostoker et al. | 437/187 |
| 5,659,201 A | 8/1997 | Wollesen | 257/758 |
| 5,811,375 A | 9/1998 | Nakamura et al. | 505/413 |
| 5,900,668 A | 5/1999 | Wollesen | 257/522 |
| 6,016,000 A | 1/2000 | Moslehi | 257/522 |
| 6,042,998 A | 3/2000 | Brueck et al. | 430/316 |
| 6,071,809 A | 6/2000 | Zhao | 438/634 |
| 6,083,842 A | 7/2000 | Cheung et al. | 438/706 |
| 6,096,641 A | 8/2000 | Kunikiyo | 438/653 |
| 6,103,624 A | 8/2000 | Nogami et al. | 438/687 |
| 6,124,198 A | 9/2000 | Moslehi | 438/622 |
| 6,127,263 A | 10/2000 | Parikh | 438/637 |
| 6,133,051 A | 10/2000 | Hintermaier et al. | 438/3 |
| 6,144,096 A | 11/2000 | Lopatin | 257/751 |
| 6,144,099 A | 11/2000 | Lopatin et al. | 257/758 |
| 6,157,081 A | 12/2000 | Nariman et al. | 257/752 |
| 6,174,799 B1 | 1/2001 | Lopatin et al. | 438/627 |
| 6,358,848 B1 | * 3/2002 | Lopatin | 438/687 |
| 6,368,967 B1 | * 4/2002 | Besser | 438/687 |

OTHER PUBLICATIONS

U.S. application Ser. No. 09/844,845, filed Apr. 27, 2001; entitled "Superconducting Damascene Interconnect for Integrated Circuit"; copending commonly assigned.

* cited by examiner

Primary Examiner—Carl Whitehead, Jr.
Assistant Examiner—Pamela Perkins
(74) Attorney, Agent, or Firm—Renner, Otto, Boisselle & Sklar, LLP

(57) ABSTRACT

A semiconductor device including a damascene superconducting interconnect, formed of a Ba—Cu—Ca—O superconducting material. A method of forming a superconducting damascene interconnect structure, and the structure made thereby, the method including forming a cavity in an interlevel dielectric; forming a barrier layer in the cavity; forming a seed layer in the cavity over the barrier layer; forming a Cu—Ba alloy layer; filling the cavity by depositing a Cu—Ca—O film; and annealing in oxygen flow to form a Ba—Cu—Ca—O superconductor on the barrier layer. In an alternate embodiment, no barrier layer is formed.

21 Claims, 10 Drawing Sheets

METHOD OF ELECTROCHEMICAL FORMATION OF HIGH $T_C$ SUPERCONDUCTING DAMASCENE INTERCONNECT FOR INTEGRATED CIRCUIT

FIELD OF THE INVENTION

The present invention relates to a semiconductor device comprising a superconducting damascene interconnect, and a method of manufacturing the semiconductor device. The invention has particular applicability in manufacturing high density semiconductor devices with deep submicron design features which require low RLC delay interconnections between active devices.

BACKGROUND ART

Current demands for high density and performance associated with ultra large scale integration (ULSI) require submicron features of significantly less than 0.25 microns, increased transistor and circuit speeds and improved reliability. As feature size decreases, the sizes of the resulting transistors as well as those of the interconnects between transistors also decrease. Fabrication of smaller transistors allows more transistors to be placed on a single monolithic substrate, thereby allowing relatively large circuit systems to be incorporated on a single, relatively small die area. This trend toward reduced feature sizes imposes severe demands on many aspects of IC fabrication, including interconnect formation. In the manufacture of integrated circuits, after the individual devices, such as the transistors, have been fabricated in the silicon substrate, they must be connected together to perform the desired circuit functions. The connections are commonly referred to as interconnects. Narrower interconnects have reduced cross-sectional area, which results in a higher interconnect resistance for a given interconnect material. This interconnect resistance, along with the capacitance of the interconnect with respect to ground and other interconnects, contributes to an RLC (resistive-inductive-capacitive) time constant which characterizes delays associated with propagation along the interconnect line. Fabrication of a circuit with increased RLC time constants lowers the speed at which the circuit can operate by increasing the time needed, for example, for a circuit output voltage to respond to a change in input voltage. Although there are other parasitic resistances and capacitances in an integrated circuit, such as those associated with the transistors themselves, in modern circuits having submicron feature sizes interconnects may contribute as much as 80% of the total circuit delay time. The increased interconnect resistance described above places a limit on how narrow interconnect lines can be and maintain tolerable interconnect resistance. The greater the resistivity of the interconnect material, the wider the lines must be, as discussed further below. As feature size decreases and transistor density increases, multiple layers of interconnect must be used to connect the transistors to each other and to the terminals of the integrated circuit. The limitation discussed above on the narrowness of interconnect lines can exacerbate this need for multiple interconnect layers. Fabrication of each interconnect layer requires deposition and patterning processes, adding to the expense of the circuit and increasing the opportunity for defect incorporation and the resulting yield reduction. It is therefore desirable to minimize the number of interconnect layers required.

Lowering the resistivity of the interconnect material alleviates the interconnect-related problems discussed above. Resistance, R, along the length of a structure formed from a given material is related to the resistivity, $\rho$, of the material by $R = \rho l/A$, where 1 is the length of the structure and A is its cross-sectional area. It can therefore be seen that lowering the resistivity of an interconnect material reduces the resistance of an interconnect line of a given cross-sectional area. Furthermore, a line formed from a lower-resistivity material could be made narrower before an unacceptable resistance level is reached than a line formed from a higher-resistivity material. This ability to form narrower lines may allow fewer interconnect levels to be used to form the required connections for an IC, thereby reducing costs and potentially increasing the yield of correctly-functioning circuits.

Advantages such as those described above of low-resistivity interconnect materials have driven a movement in the semiconductor industry toward replacing aluminum interconnects with interconnects made from copper. The resistivity of pure copper (about 1.7 $\mu\Omega\cdot$cm) is significantly lower than that of pure aluminum (about 2.6 $\mu\Omega\cdot$cm). Both aluminum and copper interconnects typically contain small concentrations of other elements to improve interconnect reliability. These added elements increase the resistivity of the metal, but practical copper interconnects still have resistivities up to 40% lower than those of practical aluminum interconnects. Copper interconnects can therefore be made narrower than aluminum interconnects for a given value of interconnect resistance. This may result in fewer levels of metallization being needed with copper interconnects. For a given interconnect cross-sectional area, copper interconnects exhibit lower resistances, and therefore shorter interconnect-related delays, than do aluminum interconnects.

Because copper is more difficult to etch than aluminum, in addition to difficulties in etching narrow features in metals in general as compared to etching of insulators, copper interconnects are generally formed by a damascene process.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductive material and to act as a barrier material to prevent diffusion of such conductive material into the oxide layer and the semiconductor devices. A first conductive material is then deposited and subjected to a chemical-mechanical polishing process which removes the first conductive material above the first channel oxide layer and damascenes the first conductive material in the first channel openings to form the first channels.

The via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via. A second chemical mechanical polishing process leaves the two vertically separated, horizontally perpendicular channels connected by cylindrical vias.

The use of the dual damascene technique eliminates metal etch and dielectric gap fill steps typically used in the metallization process. The elimination of metal etch steps is important as the semiconductor industry moves from aluminum to other metallization materials, such as copper, which are very difficult to etch.

Improvements in circuit speed gained by moving from aluminum to copper have been quite beneficial as circuit speeds have increased by moving the working frequency into the range of about 1 GHz. However, development of integrated circuits having a working frequency in the range from 5 to 50 GHz requires even lower RLC delay interconnections than can be provided by copper. Thus, there exists a need semiconductor devices having interconnections having an RLC delay significantly lower than that provided by copper.

SUMMARY OF THE INVENTION

The present invention relates to a superconducting damascene interconnect structure for a semiconductor device, and to a method for fabricating the superconducting damascene interconnect structure. Thus, the present invention solves the problem of providing a significantly reduced RLC delay interconnection by replacing the conventional damascene interconnect materials with a superconductor. In addition, the present invention relates to a method of fabricating the superconducting damascene interconnect structure by a series of steps which are simple and conventional, but which avoid known problems associated with formation of damascene interconnects.

Thus, the present invention provides a method of forming a superconducting damascene interconnect structure, including:
 forming a cavity in an interlevel dielectric;
 forming a barrier layer in the cavity;
 forming a seed layer in the cavity over the barrier layer;
 forming a Cu—Ba alloy layer;
 filling the cavity by depositing a Cu—Ca—O film; and
 annealing in oxygen flow to form a Ba—Cu—Ca—O superconductor on the barrier layer. In one embodiment, the Ba—Cu—Ca—O superconductor has a formula $Ba_2Cu_xCa_{x-1}O_{2x+3}$, wherein x=3 or 4.

In another embodiment, the present invention relates to a method of forming a superconducting damascene interconnect structure, including:
 forming a cavity in an interlevel dielectric;
 forming a seed layer in the cavity;
 forming a Cu—Ba alloy layer;
 filling the cavity by depositing a Cu—Ca—O film; and
 annealing in oxygen flow to form a Ba—Cu—Ca—O superconductor on the interlevel dielectric.

In another embodiment, the present invention relates to a damascene interconnect in a semiconductor device, including a Ba—Cu—Ca—O superconductor formed in a cavity in a dielectric material. In one embodiment, the Ba—Cu—Ca—O superconductor has a formula $Ba_2Cu_xCa_{x-1}O_{2x+3}$, wherein x is in the range from greater than 1 to about 6. In one embodiment, x is in the range from about 2 to about 5, in another from about 3 to about 4. In one embodiment, x=3, and in another embodiment, x=4. In one embodiment, the Ba—Cu—Ca—O has a high $T_c$ of about 126° K. In one embodiment, the Ba—Cu—Ca—O superconductor further comprises Rhenium, Re. Thus, in this embodiment, the superconductor is a Re—Ba—Cu—Ca—O superconductor. The Re—Ba—Cu—Ca—O superconductor has a high $T_c$ of about 131° K.

Thus, the present invention provides a solution to the problem of providing semiconductor devices having interconnections having an RLC delay significantly lower than that provided by copper. The present invention provides a method for making a device, and a device, having a working frequency in the range from 5 to 50 GHz, which results in lower RLC delay interconnections than can be provided by copper.

DETAILED DESCRIPTION

The method of the present invention may be applied to a semiconductor device as a dual damascene or single damascene process. In one embodiment, the process is applied as a dual damascene process, in which the same conductive material is used for vias and overlying interconnect lines, and both via and line dielectrics are deposited before trench formation and filling. In a single damascene process, vias are formed before deposition of a line dielectric and subsequent trench formation and filling to create interconnect lines. Vias and lines may be formed from different dielectrics in single damascene processes. The same structure or different structures may be obtained by these processes. The method of the present invention is described in terms of a dual damascene process. However, as will be understood by those of skill in the art, the method is applicable to a single damascene process. Thus, as used herein, the term "damascene" refers to both a single damascene process and a dual damascene process.

As used herein, the term "cavity" may refer to either or both of a via or a channel for an interconnect, and any similar structure in which a damascene interconnect may be formed. The channel may also be referred to as a trench before it is filled with a conductive material to form a channel. Thus, when the term "cavity" is used, it is understood that either or both of these terms may be intended. When specific reference to either such term, or to other terms encompassed by the term cavity is intended, such structure will be specifically identified.

First Embodiment: Semiconductor Device

In a first embodiment, the present invention relates to a semiconductor device including a superconducting damascene interconnect. In one embodiment, the superconducting damascene interconnect is formed of a Ba—Cu—Ca—O superconducting material. In one embodiment, the Ba—Cu—Ca—O superconducting material has a chemical formula $Ba_2Cu_xCa_{x-1}O_{2x+3}$, wherein x is in the range from greater than 1 to about 6. In one embodiment, x is in the range from about 2 to about 5, in another from about 3 to about 4. In one embodiment, x=3, and in another embodiment, x=4. The minimum value of x should be greater than 1, since otherwise according the to above formula, the Ba—Cu—Ca—O superconducting material would include no calcium. According to the formula, in one preferred embodiment, the superconducting material has a formula $Ba_2Cu_3Ca_2O_9$, when x=3, and in another preferred embodiment, the superconducting material has a formula $Ba_2Cu_4Ca_3O_{11}$, when x=4. The value of x may include non-integral values, e.g., x=3.5. The non-integral value of x may be observed particularly in embodiments in which the Ba—Cu—Ca—O superconducting material includes rhenium, e.g., as an additive or dopant, as disclosed in more detail below.

Figure 1:
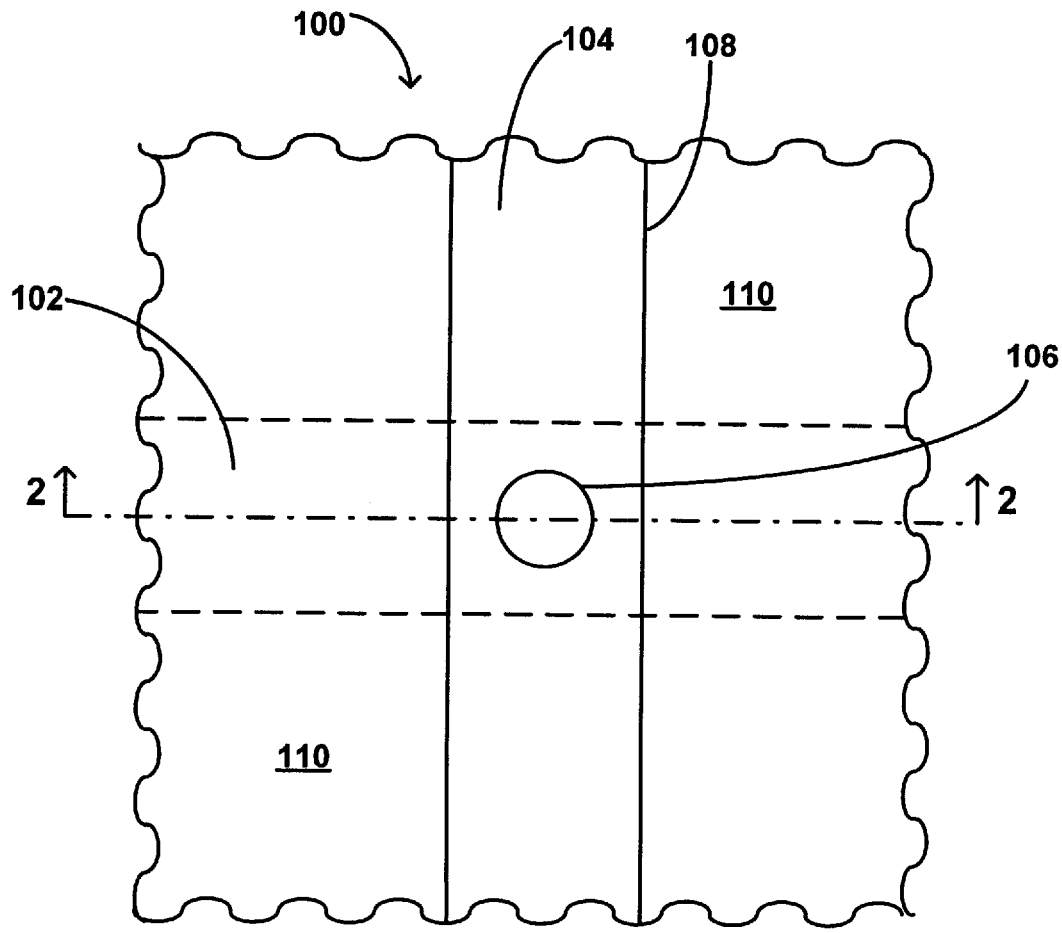
FIG. 1 is a plan view of an embodiment of a superconducting damascene interconnect, in accordance with the present invention.

Referring first to FIG. 1, therein is shown a plan view of a pair of aligned semiconductor damascene channels of a conductive material such as aluminum, copper, tungsten, polysilicon or, in the present invention, a superconductor material, disposed over a production semiconductor wafer 100. A first damascene channel 102 is shown disposed below a second damascene channel 104 which extends substantially perpendicular to the first channel 102 in the plan view. A round via 106 connects the first and second damascene channels 102 and 104 and is a part of the second damascene channel 104. In one embodiment, the via 106 is an integral part of the second damascene interconnect channel 104, the via 106 and the second channel 104 being formed as a single structure. The first damascene channel 102 comprises a first conductive material. In one embodiment, the first conductive material is the Ba—Cu—Ca—O superconducting material in accordance with the present invention. The second damascene channel 104 is formed by filling a second channel opening 108 disposed in a second channel dielectric layer 110 with a second conductive material. In one embodiment, the second conductive material is the Ba—Cu—Ca—O superconducting material in accordance with the present invention.

Figure 2:
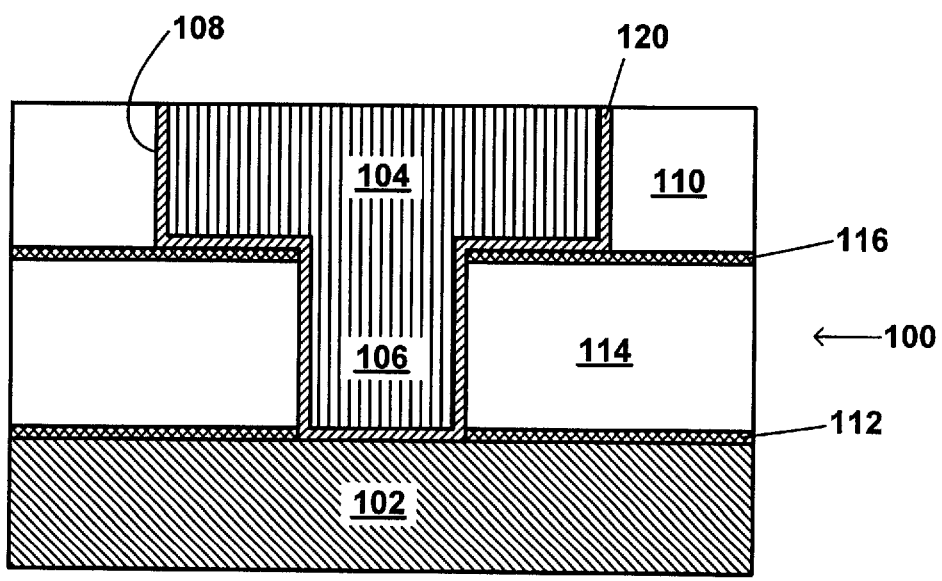
FIG. 2 is a partial cross-sectional view of one embodiment of a superconducting damascene interconnect, taken at line 2—2 of FIG. 1, in accordance with a first embodiment of the present invention.

Referring now to FIG. 2, therein is shown a cross-section, taken along a line 2—2 in FIG. 1, of a semiconductor device 100 in accordance with a first embodiment of the present invention. The first damascene channel 102 may be disposed over active circuit elements such as, e.g., a polysilicon gate and a dielectric of a semiconductor device on an integrated circuit chip (not shown). The first and second damascene channels 102 and 104 are in horizontal planes separated vertically by a stop nitride layer 112, a via dielectric layer 114, and a thin via nitride layer 116. One or more of these layers may be referred to as an interlevel dielectric (ILD). The cross-sectional area of the round via 106 of FIG. 1 forms a cylindrical via when it is filled with the second conductive material. The via 106 may have other cross-sectional shapes, such as square, rectangular, ovoid or elliptical.

The semiconductor device 100 of the embodiment of FIG. 2 includes a barrier layer 120 disposed around the second damascene channel 104 and the via 106. The barrier layer 120 separates the second channel 104 and the via 106 from the second channel dielectric layer 110 and the via dielectric layer 114, respectively, and thus from the remainder of the semiconductor wafer 100. The barrier layer 120 provides insulation between the material of the second channel 104 and the via 106 and the second channel dielectric layer 110 and the via dielectric layer 114, respectively. The barrier layer 120 may act to prevent diffusion, migration or electromigration of metals such as copper from the conductive material in the channel 102 and the via 106 into the adjacent dielectric layers.

The barrier layer 120 may be formed from one or more of Ta, TaN, TaSiN, TiSiN, TiW, or WN or similar materials known in the art. The barrier materials may also include cobalt (Co), nickel (Ni), palladium (Pd), molybdenum (Mo) and tungsten (W). The barrier may be formed of an alloy, for example, NiW, NiTa, NiMo, CoW, CoTa, CoMo, PdW, PdTa, and PdMo.

The barrier layer 120 should be conductive, so as to provide electrical connection between the second channel 104 and the underlying first channel 102. The barrier layer 120 may also promote adhesion of the Ba—Cu—Ca—O superconducting material of the channel to the material of the adjacent dielectric materials.

Figure 3:
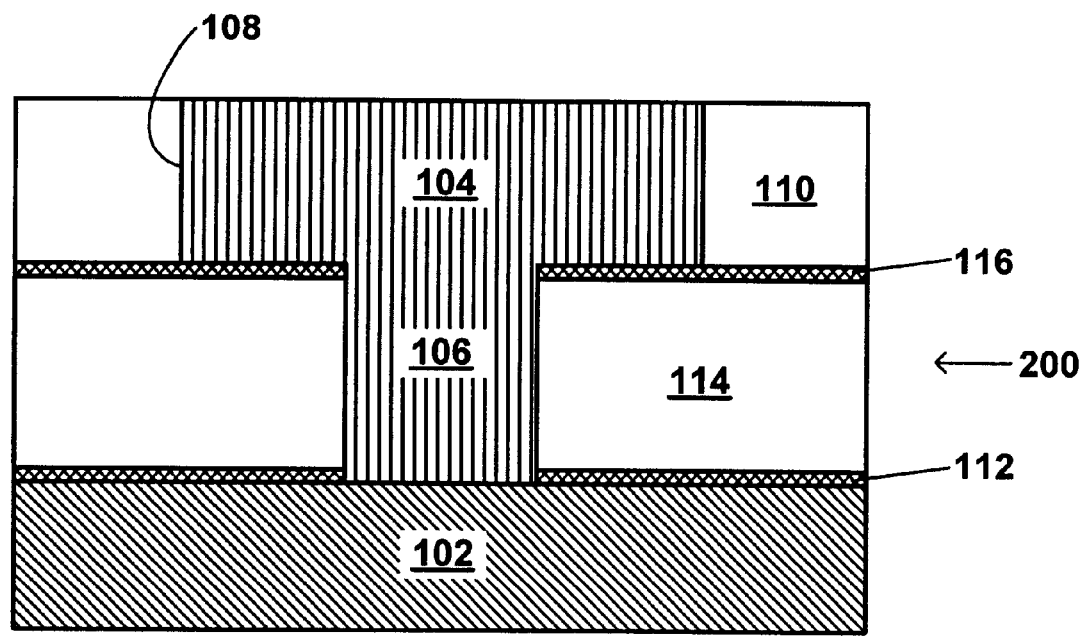
FIG. 3 is a partial cross-sectional view of another embodiment of a superconducting damascene interconnect, taken at line 2—2 of FIG. 1, in accordance with a second embodiment of the present invention.

Referring now to FIG. 3, therein is shown a cross-section, taken along a line 2—2 in FIG. 1, of a semiconductor device 200 in accordance with a second embodiment of the present invention. This embodiment is similar to the embodiment of FIG. 2 except that it does not include a barrier layer. As in the first embodiment, in the second embodiment the first damascene channel 102 may be disposed over active circuit elements such as, e.g., a polysilicon gate and a dielectric of a semiconductor device on an integrated circuit chip (not shown). The first and second damascene channels 102 and 104 are in horizontal planes separated vertically by a stop nitride layer 112, a via dielectric layer 114, and a thin via nitride layer 116. The cross-sectional area of the round via 106 of FIG. 1 forms a cylindrical via when it is filled with the second conductive material. The via 106 may have other cross-sectional shapes as described above.

In the second embodiment, shown in FIG. 3, the semiconductor device 200 does not require a barrier layer. In one embodiment, the Ba—Cu—Ca—O superconducting material does not include species which may migrate, move or diffuse into the adjacent ILD. In one embodiment, the adjacent ILD is formed of a material, such as a low-k dielectric material, which is not susceptible to diffusion, migration, or electromigration of conductive atoms from the adjacent damascene interconnect or channel. For example, an ILD formed by benzocyclobutene (BCB) type resin is substantially not susceptible to such movement of conductive atoms.

In the embodiments shown in FIGS. 2 and 3, each of the first damascene channel 102 and the second damascene channel 104 and the cylindrical via 106 may comprise a superconductor material, as described more fully below. The embodiments shown in FIGS. 2 and 3 may include a Ba—Cu—Ca—O superconductor formed in either or both of the damascene channels 102 and 104 and the via 106. In one embodiment, both of the damascene channels 102 and 104, and the via 106, comprise a Ba—Cu—Ca—O superconductor.

In one embodiment the Ba—Cu—Ca—O superconductor has a formula $Ba_2Cu_xCa_{x-1}O_{2x+3}$, wherein x is in the range from greater than 1 to about 6. In one embodiment, x is in the range from about 2 to about 5, in another from about 3 to about 4. In one embodiment, x=3, and in another embodiment, x=4.

In one embodiment, the Ba—Cu—Ca—O superconductor has a high critical temperature, Tc. In one embodiment, the Tc is in the range from about 92° K. to about 132° K. In one embodiment, the Tc is about 126° K. to about 131° K. In one embodiment, the Tc is about 126° K.

In one embodiment, the Ba—Cu—Ca—O superconductor is formed by a method which includes filling the cavity by depositing a Ba—Cu alloy layer, depositing a Cu—Ca—O film layer, and annealing these layers in an oxygen flow to form the Ba—Cu—Ca—O superconductor. In one embodiment, the Ba—Cu alloy layer and the Cu—Ca—O film layer are sequentially deposited in repeated layers, and the combined layers are annealed in an oxygen flow to form the Ba—Cu—Ca—O superconductor. This process is described in greater detail hereinbelow.

In one embodiment, the Ba—Cu—Ca—O superconductor further comprises rhenium, Re, in addition to the Ba—Cu—Ca—O. In this embodiment, the Re is present in an amount from about 1% to about 10% on an atomic basis of the Ba—Cu—Ca—O superconductor. In this embodiment, the Ba—Cu—Ca—O superconductor has approximately the same formula, $Ba_2Cu_xCa_{x-1}O_{2x+3}$, wherein x is in the range from greater than 1 to about 6, with the Re present, e.g., in the form of a dopant or an additive. The presence of the Re allows the superconductor to obtain a $T_c$ of about 131° K.

In one embodiment, the via dielectric layer 114 and the second channel dielectric layer 110 are formed of a conventional dielectric material, such as silicon dioxide, silicon nitride, or silicon oxynitride. In another embodiment, the via dielectric layer 114 and the second channel dielectric layer 110 are formed of a low-k dielectric. A low-k dielectric is a dielectric material which exhibits a dielectric constant substantially less than conventional dielectric materials. Silicon dioxide has a dielectric constant of about 3.9–4.0. Air has a dielectric constant of 1. A low-k dielectric material has a dielectric constant in the range from about 1.1 to about 3.8. In one embodiment, the low-k dielectric material is a plastic-type polymer, which has a k value in the range of about 2.0 to about 3.5. In one embodiment, the low-k dielectric material is formed of benzocyclobutene ("BCB") resin. BCB has a dielectric constant of about 2.7. In another embodiment, the low-k dielectric material is a deposition type and/or spin-on type material having a fluorine component. In one embodiment, the low-k dielectric is plasma polymerized hydrocarbylsilane, such as disclosed in U.S. Pat. No. 5,439,780, which the hydrocarbyl component may be alkyl, aryl and/or hydrogen. In another embodiment, the low-k dielectric material is a polymer of one of hydrogen silsesquioxane (HSQ), tetraethyl orthosilicate (TEOS), benzocyclobutene (BCB), parylene, polynapthalene or polyimide. Other organic low-k materials include polymers of hydrogen silsesquioxane, fluorinated polyimide, polyphenylquinoxaline, polyquinoline, and methylsilsesquixane-polymer.

With respect to the low-k dielectric materials having a fluorine component, fluorine may be introduced into a standard dielectric deposition process or a standard spin-on process. Examples of low-k fluorine incorporated dielectric materials include for example, fluorosilicate glass (FSG), silicon oxyfluoride (FxSiOy), hydrogen silsesquioxane, fluorinated polysilicon, poly-phenylquinoxaline, polyquinoline, methylsilsesquixane polymer, and fluoropolyimide. The low-k material may have a fluorine concentration in the range of 3–20 atom percent. Such F-based films have a k value in the range of 3.0–3.8.

Air-gap technology may also be used to lower the dielectric constant, k, between superconducting interconnects. This technology may include removal of dielectric material between interconnect lines to form air gaps having a k of 1.

Second Embodiment—Method 1

Figure 15:
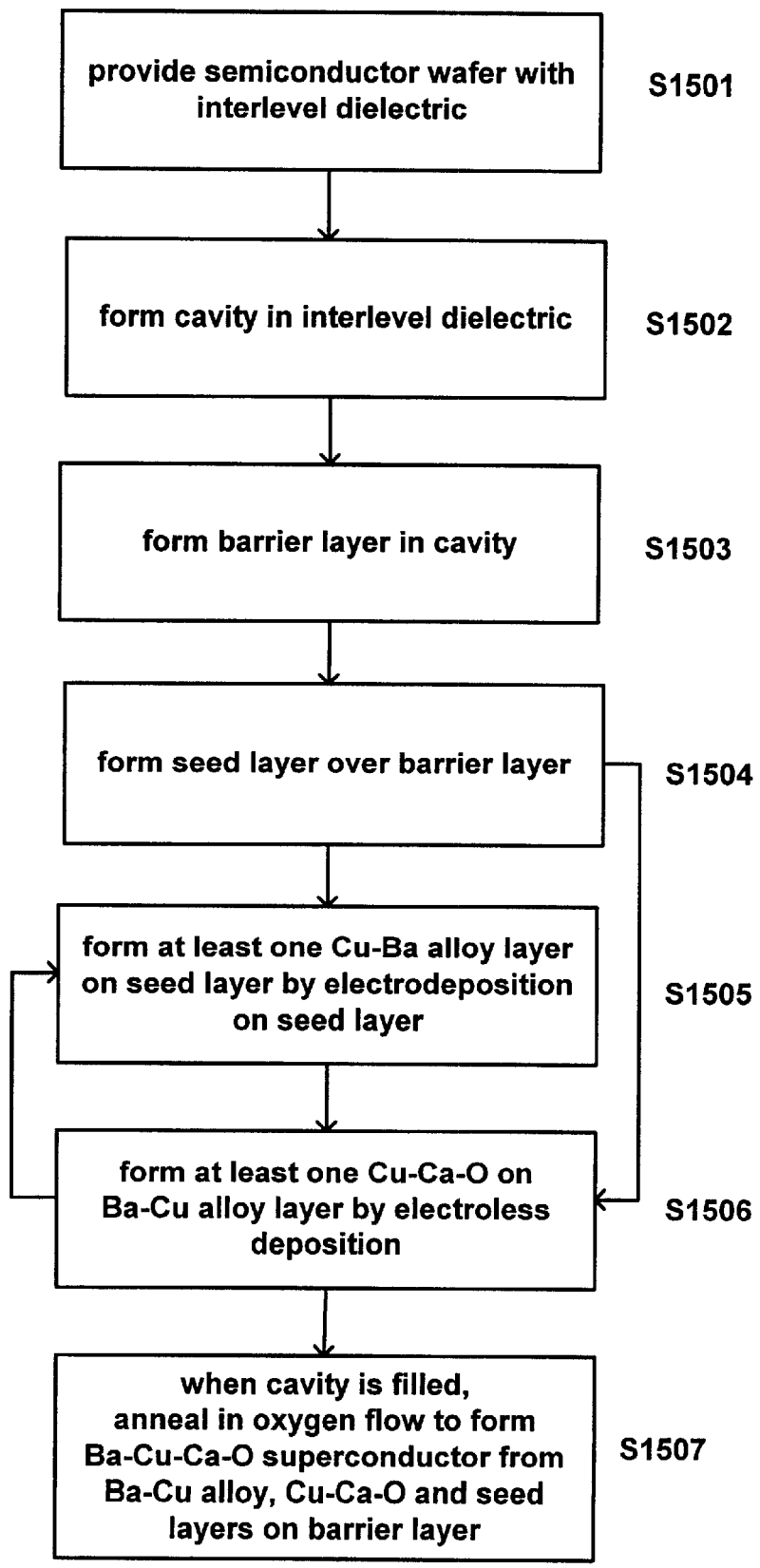
FIG. 15 is a flow diagram of a method of fabrication of a first embodiment of a superconductor damascene interconnect.

In one embodiment, the present invention provides a method of forming a superconducting damascene interconnect structure, including forming a cavity in an interlevel dielectric; forming a barrier layer in the cavity; forming a seed layer in the cavity over the barrier layer; forming a Cu—Ba alloy layer; filling the cavity by depositing a Cu—Ca—O film; and annealing in oxygen flow to form a Ba—Cu—Ca—O superconductor on the barrier layer. In one embodiment, the Ba—Cu—Ca—O superconductor has a formula $Ba_2Cu_xCa_{x-1}O_{2x+3}$, wherein x is in the range from greater than 1 to about 6. In one embodiment, x is in the range from about 2 to about 5, in another from about 3 to about 4. In one embodiment, x=3, and in another embodiment, x=4. Pertinent details of this method to fabricate the device shown in FIG. 2 are set forth in the following, with reference to FIGS. 4–10 and 15. FIG. 15 is a process flow diagram of the steps of the method of this embodiment as outlined here.

As the first step of the method, a semiconductor device 100 is provided, as shown in Step S1501 in FIG. 15. Included in this step, the first channel 102 in a first channel oxide layer (not shown) above portions of a semiconductor device (not shown) may be applied using a first damascene process over a production semiconductor wafer 100. The damascene process may be a photolithographic process which uses a mask to define a first channel opening (not shown) in the first channel oxide layer. The first channel opening is then filled with the optional adhesion, barrier, and conductive material. The stop nitride layer 112, the via dielectric layer 114, and the via nitride layer 1 16 would be successively deposited on top of the conductive material in the first channel 102 and the first channel oxide layer using deposition techniques such as those described hereinbelow in more detail with respect to the second channel 104. As noted above, the first channel material may be a superconductor material as disclosed herein, formed by a method such as that disclosed herein.

Figure 4:
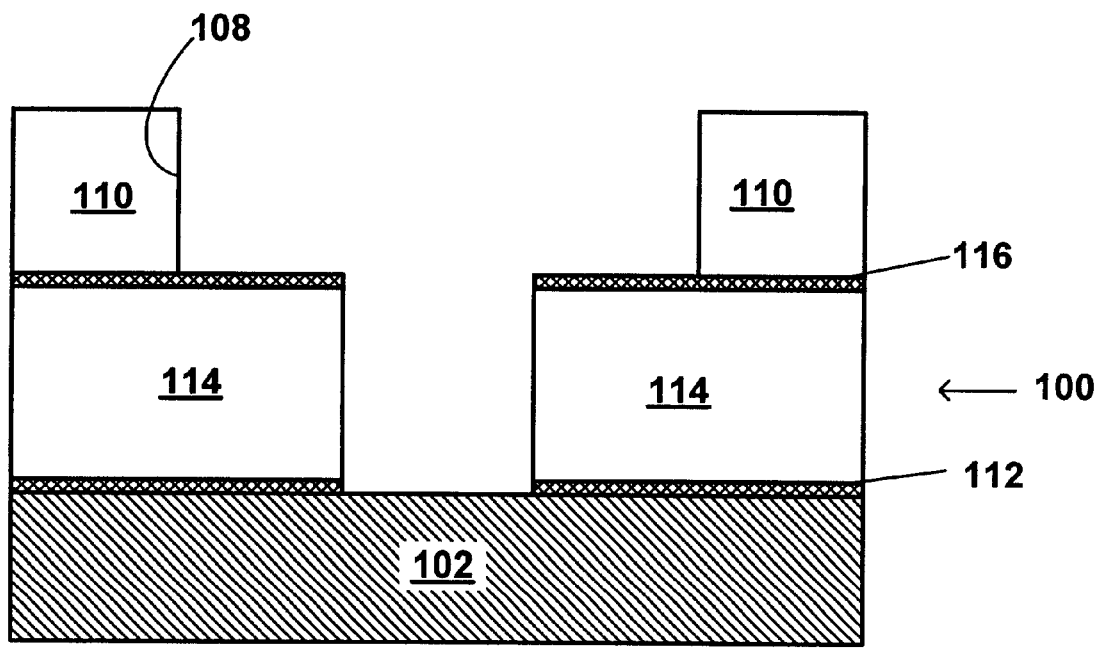
FIG. 4 is a partial cross-sectional view of a cavity for an interconnect formed in a dielectric, in accordance with the first embodiment of the present invention.

As shown in FIG. 4 and as Step S1502 in FIG. 15, a cavity forming the channel 104 and the via 106 is formed next. The cavity is formed by using a via photoresist and a via photolithographic process followed by nitride etching of a round via opening 106 in the via nitride layer 116. Thus, the basis for the cylindrical via 106 was formed. Thereafter, the second channel dielectric layer 110 is formed, which prepares the way for the second channel 104 to be perpendicular to the first channel 102.

This damascene process uses a photolithographic process in which a mask defines the second channel opening 108 in the second channel dielectric layer 110. Since the second damascene process uses an anisotropic etch of the dielectric material, the etch also forms the cylindrical via opening 106 down to the stop nitride layer 112 while forming the second channel opening 108. The anisotropic oxide etch etches faster in the vertical direction of FIGS. 2 and 3 than in the horizontal direction. The nitride etch of the stop nitride layer 112 exposes a portion of the first channel conductive material 102 and completes the etching steps forming the structure shown in FIG. 4.

The step of forming a cavity, such as the second channel 104 and the via 106 in an interlevel dielectric such as the second channel dielectric layer 110 and the via dielectric layer 114 may be carried out by the foregoing or any method known in the art for forming such a cavity in a dielectric material. The present invention is not limited to any particular method of cavity formation. The cavity may be formed using photolithographic patterning processes and anisotropic dry etching processes. There are several variations of patterning/etching sequences which may be used to form the cavity. For example, the second channel 104 may be patterned and etched first, followed by patterning and etching of the via 106. Alternatively, with appropriate patterning, both upper and lower parts of the trench may be etched in one step.

Figure 5:
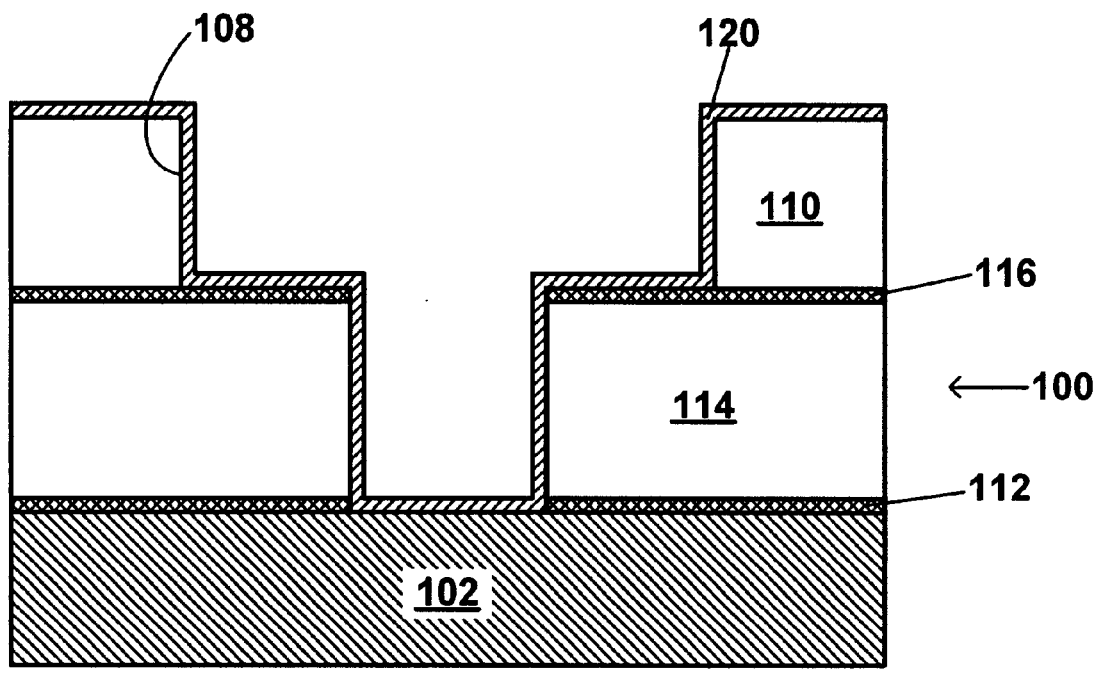
FIG. 5 is a partial cross-sectional view of a cavity for an interconnect formed in a dielectric, with a barrier layer deposited as a cavity liner, in accordance with the first embodiment of the present invention.

Thereafter, as shown in FIG. 5 and as Step S1503 in FIG. 15, a barrier layer 120 is deposited on the second channel dielectric layer 110 and the via dielectric layer 114 in the second channel opening 108 and the cylindrical via opening 106. The materials from which the barrier layer 120 may be formed include those disclosed above, and any other equivalent material known in the art. In one embodiment, the barrier layer 120 is deposited directly onto the second channel dielectric layer 110 and the via dielectric layer 114 in the second channel opening 108 and the cylindrical via opening 106, with no intervening materials. The barrier layer 120 may be considered as an adhesive layer, or an adhesion-promoting layer, which promotes adhesion between the dielectric substrate and subsequently applied layers.

Various metal deposition techniques can be used for the deposition of the barrier layer materials, such techniques include but are not limited to physical vapor deposition, chemical vapor deposition, electroless deposition, electroplating, ion-metal plasma (IMP), hollow cathode magnetron (HCM), sputtering, atomic layer deposition (ALD) or a combination thereof.

In one embodiment, the thickness of the barrier layer is from about 5 nm to about 50 nm. In another embodiment, the thickness of the barrier layer is from about 10 nm to about 30 nm.

Figure 6:
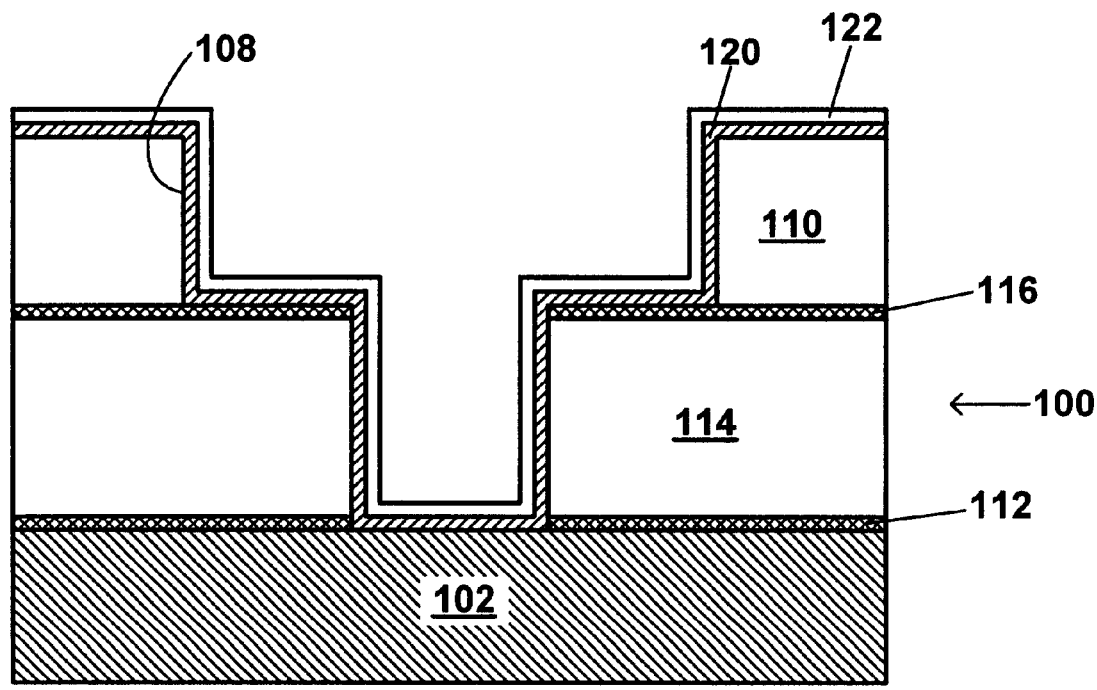
FIG. 6 is a partial cross-sectional view of a cavity for an interconnect formed in a dielectric, with a seed layer formed on a barrier layer, in accordance with the first embodiment of the present invention.

Next, as shown in FIG. 6 and as Step S1504 in FIG. 15, a seed layer 122 is formed over the barrier layer 120. The seed layer 122 may be a metal such as copper, copper-silver alloy, silver, or another highly conductive metal. In one embodiment, the seed layer 122 is copper. In one embodiment, the seed layer 122 is a copper-silver alloy, and in another embodiment, the seed layer 122 is silver. In other embodiments, the seed layer 122 may be a metal such as gold, palladium, platinum, or alloys of any of the above metals. In one embodiment, the seed layer 122 becomes an integral, chemically-reacted part of the superconductor material during subsequent annealing steps, as described more fully below. In another embodiment, a first portion of the seed layer 122 becomes an integral, chemically reacted part of the superconductor material during subsequent annealing steps, while a remaining portion does not so react and thereby retains its character substantially as deposited, as described more fully below. In the embodiment in which only a portion of the seed layer 122 becomes part of the superconductor material, the remaining part is that part adjacent the barrier layer 120.

The seed layer 122 may be deposited by any of the techniques noted above for deposition of the barrier layer 120. In one embodiment, the seed layer 122 is deposited by electrodeposition. In one embodiment, the seed layer 122 is deposited by electroless deposition. In one embodiment, the seed layer 122 is deposited directly onto the barrier layer 120, with no intervening materials.

The seed layer 122 may be quite thin. In one embodiment, the seed layer 122 is deposited to a thickness of about 1 nm to about 50 nm. In one embodiment, the seed layer 122 is deposited to a thickness of about 5 nm to about 20 nm. In another embodiment, the seed layer 122 is deposited to a thickness of about 1 nm to about 5 nm.

Figure 7:
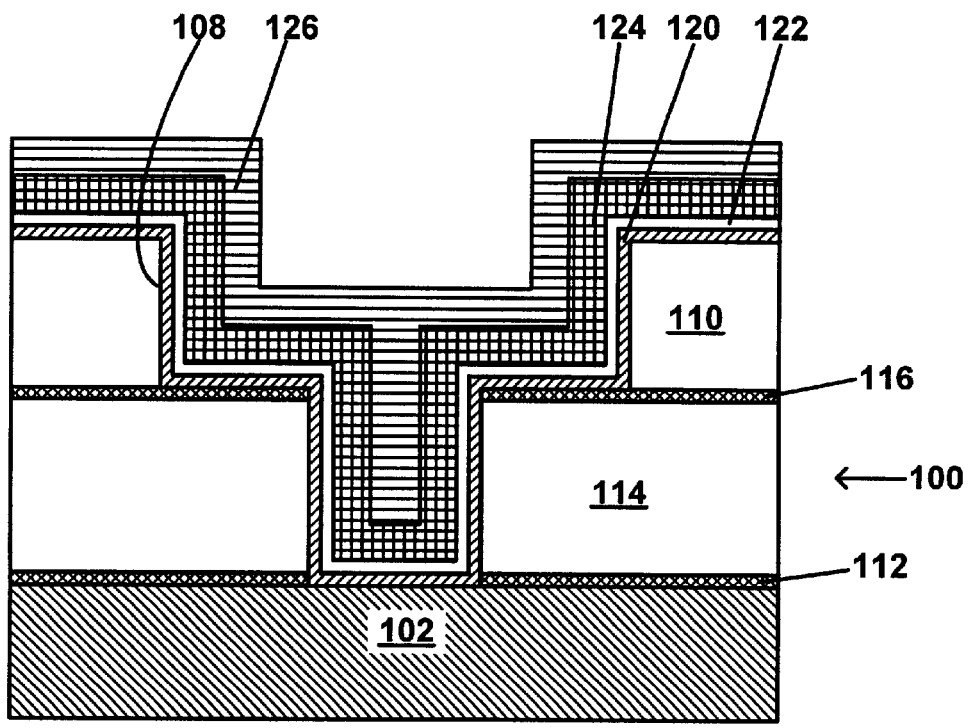
FIG. 7 is a partial cross-sectional view of a partially filled cavity for an interconnect formed in a dielectric, with a seed layer formed on a barrier layer, a first Ba—Cu alloy layer formed on a seed layer, and a first Cu—Ca—O film formed on the first Ba—Cu alloy layer, in accordance with the first embodiment of the present invention.

Next, as shown in FIG. 7 and as Step S1505 in FIG. 15, a Cu—Ba alloy layer 124 is formed over the seed layer 122. The Cu—Ba alloy layer 124 may be applied by electrodeposition. The Cu—Ba alloy layer 124 becomes an integral, chemically-reacted part of the superconductor material during subsequent annealing steps, as described more fully below.

In one embodiment, the Cu—Ba alloy layer 124 is deposited by electrodeposition. At the present time, electrodeposition (also referred to as electroplating) is considered the best mode of depositing the Cu—Ba alloy layer 124. In other embodiments, the Cu—Ba alloy layer 124 may be deposited by any of the techniques noted above for deposition of the barrier layer 120. In one embodiment, the Cu—Ba alloy layer 124 is deposited directly onto the seed layer 122, with no intervening materials.

As noted above, in one embodiment, the Cu—Ba layer is deposited by electrodeposition. In one embodiment, the electrodeposition applies a depositing current in a pulsed waveform. The use of pulsed waveform electrodeposition is known in the art. The pulsed waveform may be, for example, a square wave, trapezoidal wave, triangular wave, sinusoidal wave and random wave. The voltages of such pulsed waveforms may have both positive and negative polarities or they may have only negative polarity. The repetitive voltage components may be zero at periodic times. Alternatively, a d.c. component may be added to a periodic wave. The value of the voltage to be applied is preferably such that a maximum absolute value of current density on the surface of the substrate is in the range of from $10^{-3}$ to 1 A/cm$^2$. The low-frequency, high-frequency or ultrasonic vibrations are preferably such that their frequency is in the range of from 45 Hz to 2.5 GHz.

In one embodiment, the electrodeposition is applied using an electrolyte comprising the following components:

copper salt: copper nitrate (Cu(NO$_3$)$_2$.5H$_2$O barium salt: barium nitrate (Ba(NO$_3$)$_2$)

solvent: dimethyl sulfoxide (DMSO)

Various additives and other components as known in the art may be included in the electrolyte. In one embodiment, the electrolyte includes a silver salt, e.g., AgNO$_3$, which may improve uniformity of the electrodeposited Cu—Ba alloy layer. In addition, the electrolyte may include an acid, such as nitric acid or sulfuric acid. As described below, the Cu—Ba electrolyte may comprise rhenium.

The foregoing examples of components for the electrolyte are merely exemplary and are not intended to be either limiting or all-inclusive. Persons of skill in the art will know of additional or alternative components of suitable electrolytes for use in the electrodeposition of the Cu—Ba alloy layer 124.

As disclosed in more detail below, in one embodiment, one or more additional Cu—Ba alloy layers 124 may be deposited sequentially in a repeated pattern alternating with the step disclosed in the following.

Next, as shown in FIG. 7 and as Step S1506 in FIG. 15, a Cu—Ca—O film 126 is deposited onto the Cu—Ba alloy layer 124 in the second channel opening 104 and via opening 106. In one embodiment, the Cu—Ca—O film 126 is formed by electroless deposition. In another embodiment, the Cu—Ca—O film 126 is deposited by laser ablation, CVD or sputtering. In other embodiments, the Cu—Ca—O film 126 is deposited using other conventional metal deposition techniques, such as those identified above for deposition of the barrier layer 120.

Figure 8:
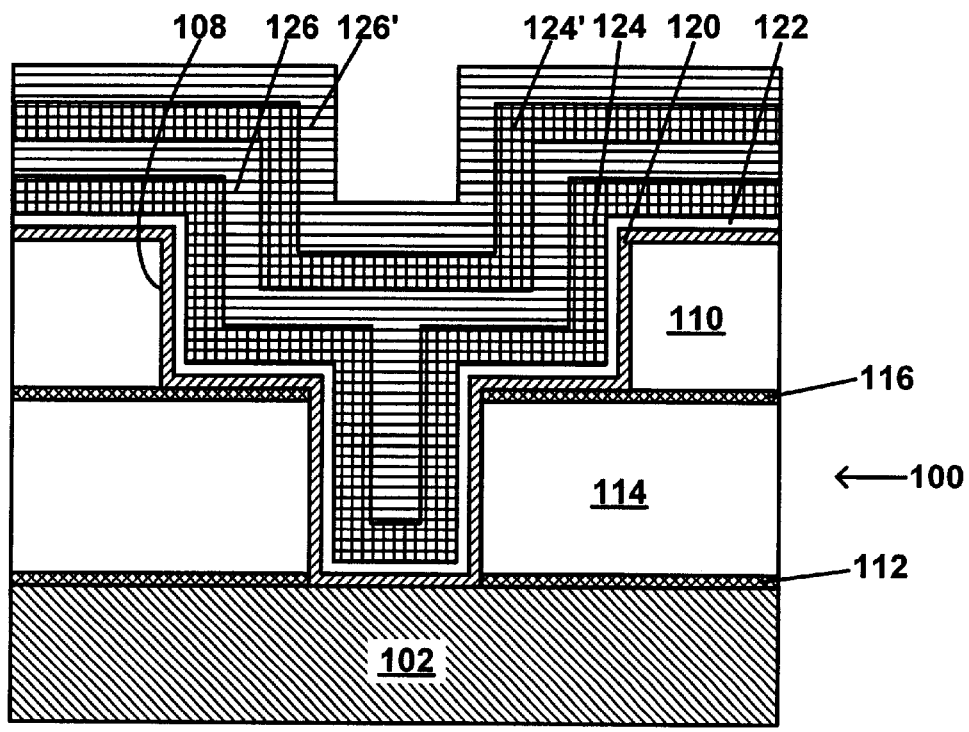
FIG. 8 is a partial cross-sectional view of a filled cavity for an interconnect formed in a dielectric, with a second Ba—Cu alloy layer formed on the first Cu—Ca—O film, and a second Cu—Ca—O film formed on the second Ba—Cu alloy layer, in accordance with the first embodiment of the present invention.

In depositing the Cu—Ca—O film 126 onto the Cu—Ba alloy layer 124, which is in turn formed on the seed layer 122, which is in turn formed on the barrier layer 120, as with each of the foregoing layers, the Cu—Ca—O film 126 forms a layer over the surface of the semiconductor device 100, as shown in FIG. 8. In one embodiment, the Cu—Ca—O film 126 is deposited directly onto the Cu—Ba alloy layer 124, with no intervening materials.

In one embodiment, the Cu—Ca—O film 126 is applied by an electroless plating method. In one embodiment, the electroless plating is applied from a solution comprising the following components:

copper salt: CuSO$_4$ calcium salt: CaCO$_3$ complexing agent: EDTA and tartaric acid reducing agent: formaldehyde (HCHO) or glyoxalic acid Various additives and alternative components as known in the art may be included in the electroless plating solution. For example, alternative complexing agents are known, such as imidazole, thioimidazole, and thiourea. The electroless plating solution may include a pH adjusting agent such as potassium hydroxide (KOH) or tetramethylammonium hydroxide (TMAH), a surfactant, such as RE 610 or TRITON®, and a stabilizing additive such as TRITON® or 2,2'-dipyridyl.

Other useful reducing agents for this invention include, hypophosphite, formaldehyde, formaldehyde precursors, homopolymers of formaldehyde such as paraformaldehyde and trioxane, ascorbic acid, glyoxal, hydrazine, hydrazine borohydrides, amino boranes such as dimethylamine borane, isopropylamine borane and morpholine borane, thiourea dioxides, alkali metal borohydrides and derivatives therefrom.

Examples of other suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono gamma-lactone, modified ethylene diamine acetates, such as N-hydroxyethyl ethylenediamine triacetate.

A satisfactory surfactant is RE-610, which is an ortho phosphate ester, available from Rhone-Poulenc Corp. under the tradename RHODAFAC® RE-610. Generally anionic and nonionic surfactants are compatible with the plating formulations. Other surfactants useful in the electroless plating solution are nonionic surfactants, such as the para-octyl phenol ether of polyethylene glycol having approximately 10 carbon atoms, commercially available under the tradename TRITON® X-100, from Aldrich Chemicals, Milwaukee, Wis. Other useful surfactants include phosphate esters, sulfonates such as sodium dodecyl sulfate, and perfluoroalkyl sulfonic acid salts.

In addition to the above-mentioned stabilizers, other stabilizing agents are exemplified by inorganic and organic compounds such as alkali metal cyanides, for example potassium cyanide or sodium cyanide, thiourea, sodium hydroxide, potassium hydroxide, potassium carbonate, sodium carbonate, and amino carboxylates such as ethlene-diaminetetraacetic acid (EDTA) and nitrilotriacetic acid (NTA).

The foregoing examples of components for electroless plating are merely exemplary and are not intended to be either limiting or all-inclusive. Persons of skill in the art will know of many variations of these electroless plating solutions.

In an embodiment in which the superconductor comprises rhenium, Re, the rhenium may be added to the electrolyte for either electrodeposition or electroless deposition of the Cu—Ba alloy layer or the Cu—Ca—O film, in the form of a salt, e.g., ammonium perrhenate, $NH_4ReO_4$, or other suitable salt, an oxide, $Re_2O_7$, a fluoride, $ReF_6$, or an acid, $HReO_4$. If other methods of deposition are used for the Cu—Ba alloy layer or for the Cu—Ca—O film, Re may be added as appropriate.

The Cu—Ca—O film 126 and the Cu—Ba alloy layer 124 applied therewith, as shown in FIG. 7, may be considered a "set" of alternating layers of these materials. At least one set of these alternating layers is applied over the surface of the semiconductor device 100, until the cavity defined by the second channel 104 and the via 106 is filled. In one embodiment of the present method, a single set of alternating layers of the Cu—Ca—O film 126 and the Cu—Ba alloy layer 124 is applied. In another embodiment, a plurality of sets of these alternating layers is applied. FIG. 8 shows an embodiment in which two sets of alternating layers of the Cu—Ca—O films 126 and 126' and the Cu—Ba alloy layers 124 and 124' have been applied onto the seed layer 122 of the semiconductor device 100.

As shown in FIG. 8, a sufficient number of sets of alternating layers should be applied to completely fill the cavity. The cavity should be filled at least to a level equal to or higher than the upper surface of the barrier layer 120. In this exemplary embodiment, the upper surface of the barrier layer 120 is considered to define the upper surface of the semiconductor device 100, for this purpose. A sufficient number of sets is applied so that when excess superconductor material is removed in subsequent steps, the resultant semiconductor device 100 can be provided with a flat, even surface, using the barrier layer 120 as a stop layer. Thus, at the end of the process, the semiconductor device 100 shown in FIG. 2 will be obtained, in which the upper surface is substantially flat and smooth.

As shown in FIG. 8, the sets of alternating layers need not be applied to a point at which the surface is completely flat and smooth. Rather, as noted above, the sets of alternating layers should be applied until the second channel 104 and the via 106 have been filled, and the lowest level of upper surface of the applied sets of alternating layers is at a level equal to or higher than the upper surface of the barrier layer 120. The uppermost layer may be a single layer, rather than a set of the two layers. That is, there may be an unequal number of the respective layers of the layers of the Cu—Ca—O film 126 and the Ba—Cu alloy layer 124.

As indicated by the arrow from Step S1504 to Step S1506 in the flow diagram of FIG. 15, Steps S1505 and S1506 may be performed in reverse order, i.e., the step of applying the Cu—Ca—O film 126 may precede the step of applying the Cu—Ba alloy layer 124, immediately following the step of applying a seed layer. In this embodiment, the respective steps as described above are performed in reverse order following the step of applying a seed layer, with each step being the same as described above.

In one embodiment, the Cu—Ba alloy layer 124 is deposited to a thickness of about 5 nm to about 200 nm. In one embodiment, the Cu—Ba alloy layer 124 is deposited to a thickness of about 10 nm to about 100 nm. In another embodiment, the Cu—Ba alloy layer 124 is deposited to a thickness of about 20 nm to about 50 nm. The Cu—Ca—O film 126 may be deposited to similar thicknesses. In one embodiment, the thickness of each Cu—Ba alloy layer 124 and each Cu—Ca—O film 126 are the same in each set of alternating layers.

Figure 9:
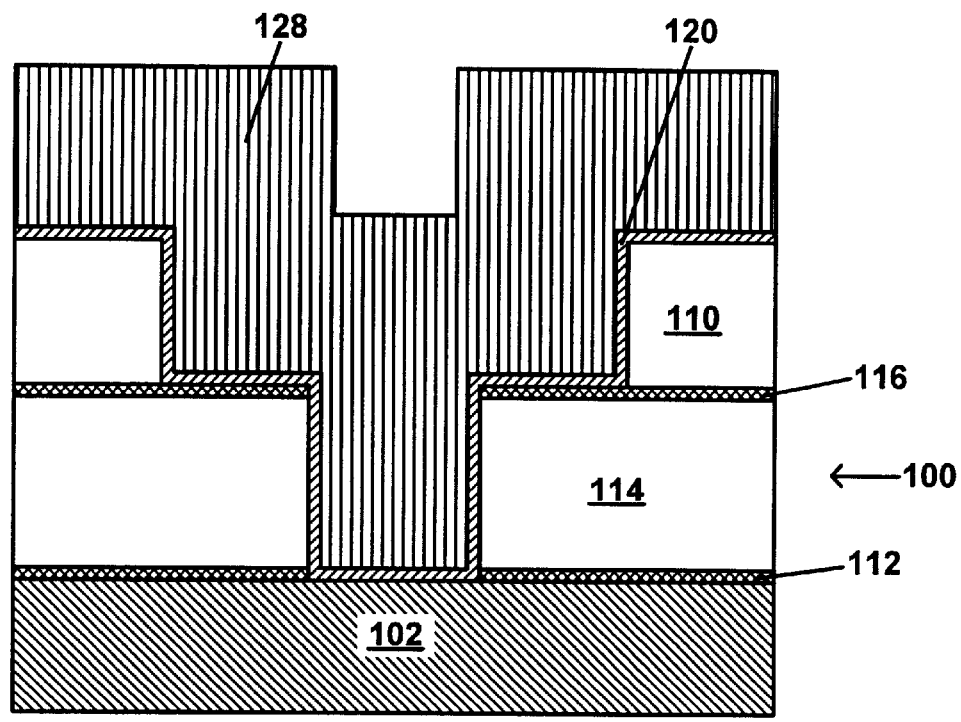
FIG. 9 is a partial cross-sectional view of a filled cavity for an interconnect, following an annealing step, with a barrier layer remaining, and with the cavity filled with a superconductor, in accordance with the first embodiment of the present invention.

As shown in FIGS. 8 and 9 and as Step S1507 in FIG. 15, with the at least one set of the Cu—Ca—O film 126 and the Ba—Cu alloy layer 124 in place and filling the second channel 104 and the via 106, the semiconductor device 100 shown in FIG. 8 is subjected to annealing in an oxygen flow. The step of annealing in an oxygen flow forms a Ba—Cu—Ca—O superconductor material 128 from the layers of the Ba—Cu alloy layer 124, the Cu—Ca—O film 126 and at least a portion of the seed layer 122, as shown in FIG. 9.

The annealing step is carried out in an oxygen flow, in which the oxygen may be provided as ozone, $O_3$, or as oxygen, $O_2$. The ozone may be generated in situ, or provided from an external source. In an embodiment in which ozone, $O_3$, is provided as the source of oxygen flow, the annealing temperature may be reduced as compared to when oxygen, $O_2$, is used. In one embodiment, the oxygen provided includes at least a portion of the oxygen in the form of singlet oxygen, $^1O$. The singlet oxygen may be generated from any known source, such as application of high energy, short wavelength UV radiation to a stream of oxygen or ozone.

The annealing conditions include exposure to the oxygen flow at temperatures in the range from about 400° C. to about 900° C. for periods of time ranging from about 10 minutes to about 1000 minutes. In one embodiment, the annealing temperature is in the range from about 500° C. to about 800° C., and in another from 600° C. to about 700° C. In one embodiment, the annealing time is in the range from about 90 minutes to about 600 minutes. In one embodiment, the annealing time is in the range from about 150 to about 450 minutes. In another embodiment, the annealing time is in the range from about 180 to about 420 minutes. In another embodiment, the annealing time is in the range from about 240 to about 360 minutes, and in one embodiment, from about 240 to about 300 minutes. With respect to all rates, ratios and ranges disclosed herein, the limits of the rates, ratios and ranges may be combined or interchanged.

The step of annealing in an oxygen flow (Step S1507) converts the Ba—Cu alloy layer 124, the Cu—Ca—O film 126 and at least a portion of the seed layer 122 into the Ba—Cu—Ca—O superconductor material 128 shown in FIG. 9. In the annealing step, the oxygen provided by the oxygen flow reacts with the Cu—Ca—O film layer 126, the Ba—Cu alloy 124 and the seed layer 122, to form the Ba—Cu—Ca—O superconducting material 128, shown in FIG. 9. In one embodiment, the Ba—Cu—Ca—O superconducting material has a formula $Ba_2Cu_xCa_{x-1}O_{2x+3}$, wherein x is in the range from greater than 1 to about 6. In one embodiment, x is in the range from about 2 to about 5, in another from about 3 to about 4. In one embodiment, x=3, and in another embodiment, x=4.

Figure 10:
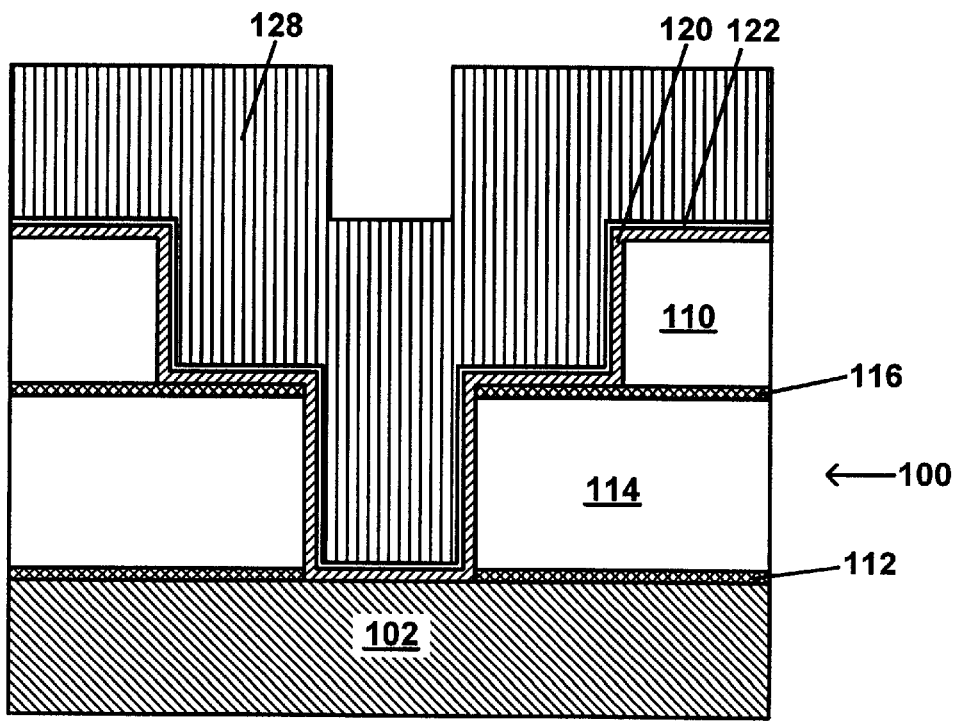
FIG. 10 is a partial cross-sectional view of a another embodiment of a filled cavity for an interconnect, following an annealing step, with a barrier layer and a portion of a seed layer remaining, and with the cavity filled with a superconductor, in accordance with the first embodiment of the present invention.

FIG. 9 shows an embodiment in which the step of annealing in an oxygen flow converts the Ba—Cu alloy layer 124, the Cu—Ca—O film 126 and substantially all of the seed layer 122 into a Ba—Cu—Ca—O superconducting material 126. FIG. 10 shows an alternative embodiment, in which the step of annealing in an oxygen flow converts the Ba—Cu alloy layer 124, the Cu—Ca—O film 126 and only a portion of the seed layer 122 into a Ba—Cu—Ca—O superconducting material 128, thus leaving a thin seed layer 122 between the superconducting material 128 and the barrier layer 120. While the embodiment shown in FIG. 9 is generally preferred, the embodiment shown in FIG. 10 is within the scope of the present invention, and may be preferred for some purposes.

Thereafter, a chemical mechanical polishing or other suitable etching and surfacing process is used to complete the process by removing excess superconductor material 126 from the upper surface of the semiconductor wafer 100, to obtain the semiconductor device shown in FIG. 2, in which the Ba—Cu—Ca—O superconducting material 126 forms the second channel 104.

As noted above, although not separately described, the same process may be used to form the first channel 102 of a Ba—Cu—Ca—O superconducting material by essentially the same steps as described herein, except that it may be unnecessary to form a via.

Third Embodiment: Method 2

Figure 16:
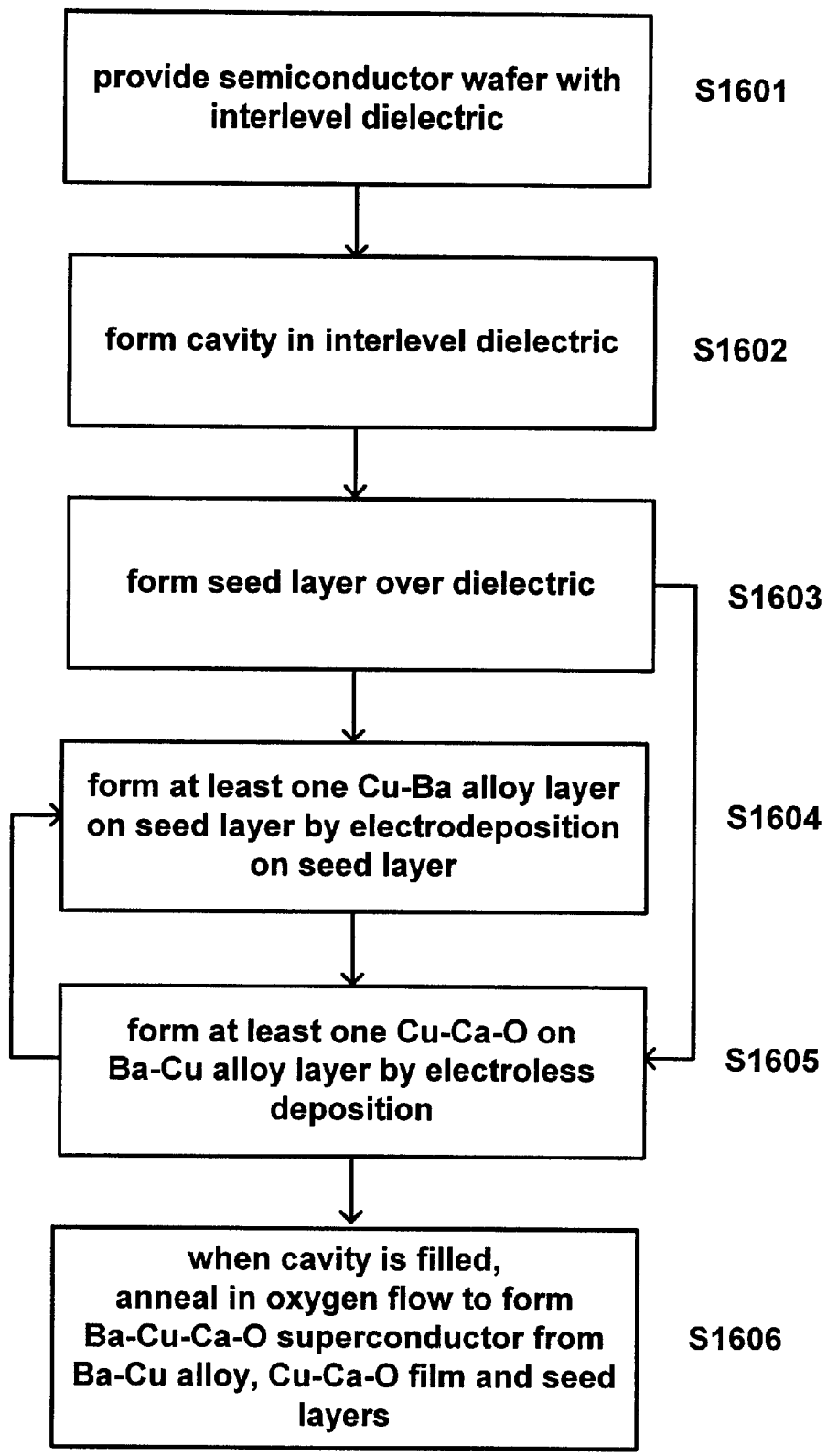
FIG. 16 is a flow diagram of a method of fabrication of a second embodiment of a superconductor damascene interconnect.

A method of forming a superconducting damascene interconnect structure, including the steps of forming a cavity in an interlevel dielectric; forming a cavity in an interlevel dielectric; forming a seed layer in the cavity; forming a Cu—Ba alloy layer; filling the cavity by depositing a Cu—Ca—O film; and annealing in oxygen flow to form a Ba—Cu—Ca—O superconductor on the interlevel dielectric. Pertinent details of this method to fabricate the device shown in FIG. 3 are set forth in the following, with reference to FIGS. 4, 11–14 and 16. FIG. 16 is a process flow diagram of the steps of the method of this embodiment as outlined here.

In this embodiment, the initial steps, shown as Steps S1601 and S1602 in FIG. 16, are essentially the same as in the previously described embodiment.

As shown in FIG. 4 and in Step S1602 of FIG. 16, the cavity is formed by using a via photoresist and a via photolithographic process followed by nitride etching of a round via opening 106 in the via nitride layer 116. Thus, the basis for the cylindrical via 106 was formed. Thereafter, the second channel dielectric layer 110 is formed, which prepares the way for the second channel 104 to be perpendicular to the first channel 102. This is substantially the same process as described above with respect to the first embodiment of the method.

As noted above, the step of forming a cavity, such as the second channel 104 and the via 106 in an interlevel dielectric such as the second channel dielectric layer 110 and the via dielectric layer 114 may be carried out by any method known in the art for forming such a cavity in a dielectric material. The present invention is not limited to any particular method of cavity formation.

Up to this point, the steps of the second embodiment of the method of the present invention have been the same as in the first embodiment of the method, and the semiconductor device 100 has been the same. Hereafter, the methods diverge, and the semiconductor device is referred to as the semiconductor device 200, since the structure hereafter is different from the semiconductor device 100.

Figure 11:
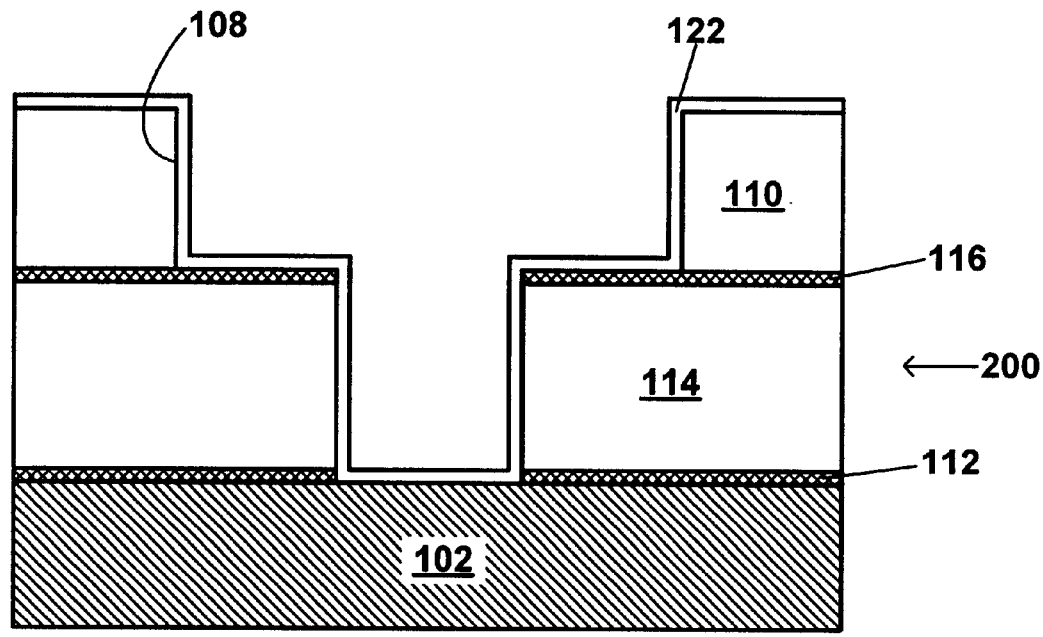
FIG. 11 is a partial cross-sectional view of a cavity for an interconnect formed in a dielectric, with a seed layer deposited as a cavity liner, in accordance with a second embodiment of the present invention.

Next, as shown in FIG. 11 and as Step S1603 in FIG. 16, a seed layer 122 is formed directly on the second channel dielectric layer 110 and the via dielectric layer 114 in the second channel opening 108 and the cylindrical via opening 106. In this embodiment, there is no barrier layer as was described above. Thus, the seed layer 122 is deposited directly on the interlevel dielectric. The seed layer 122 may be a metal such as copper, copper-silver alloy, silver, or another highly conductive metal. In one embodiment, the seed layer 122 is copper. In one embodiment, the seed layer 122 is a copper-silver alloy, and in another embodiment, the seed layer 122 is silver. In other embodiments, the seed layer 122 may be a metal such as gold, palladium, platinum, or alloys of any of the above metals. In one embodiment, the seed layer 122 becomes an integral, chemically-reacted part of the superconductor material during subsequent annealing steps, as described more fully below. In another embodiment, a first portion of the seed layer becomes an integral, chemically reacted part of the superconductor material during subsequent annealing steps, while a remaining portion does not so react and thereby retains its character substantially as deposited, as described more fully below.

The seed layer 122 may be deposited by any of the metal deposition techniques disclosed above for deposition of the seed layer 122 of the first embodiment of the method. Such techniques include but are not limited to physical vapor deposition, chemical vapor deposition, electroless deposition, electroplating, ion-metal plasma (IMP), hollow cathode magnetron (HCM), sputtering, atomic layer deposition (ALD), or a combination thereof. In one embodiment, the seed layer 122 is deposited directly onto the barrier layer 120, with no intervening materials.

When no barrier layer is used, as in the present embodiment, the interlevel dielectric should be formed of a material which is not susceptible to migration of metals such as copper from the superconducting damascene interconnect. In particular, the low-k dielectrics are useful in this regard. As noted above, many of the organic-based low-k dielectric materials are substantially not susceptible to diffusion, migration or electromigration of conductive metals such as copper.

The seed layer 122 may be quite thin. In one embodiment, the seed layer 122 is deposited to a thickness of about 1 nm to about 50 nm. In one embodiment, the seed layer 122 is deposited to a thickness of about 5 nm to about 20 nm. In another embodiment, the seed layer 122 is deposited to a thickness of about 1 nm to about 5 nm.

Figure 12:
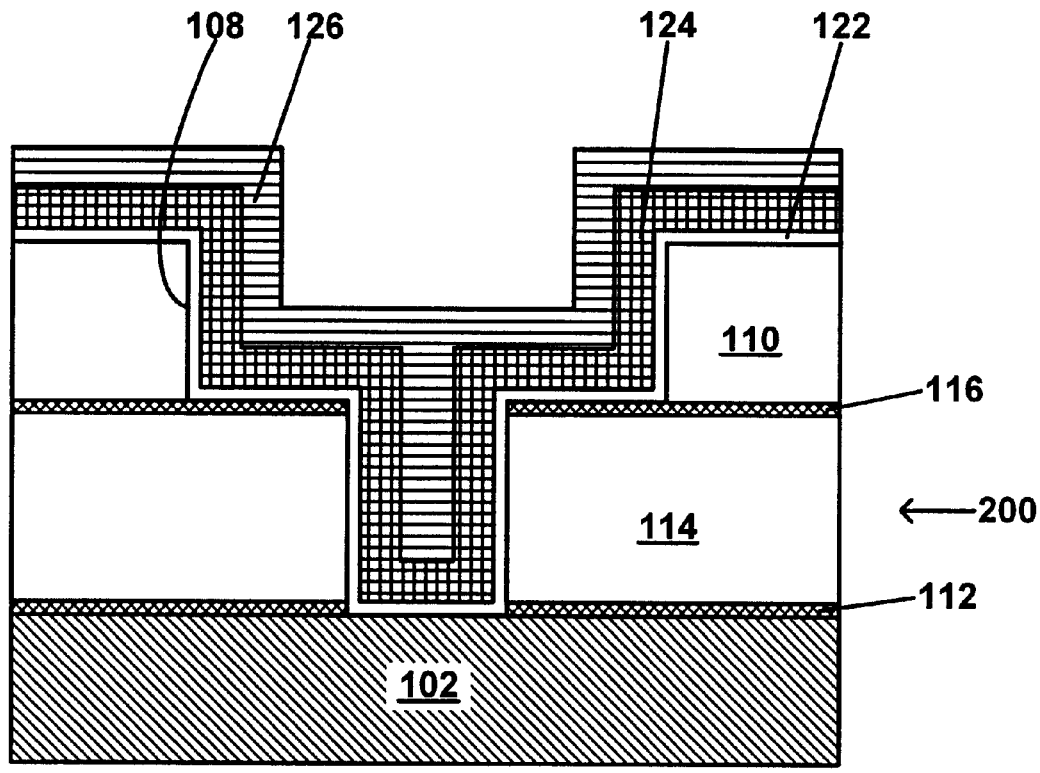
FIG. 12 is a partial cross-sectional view of a cavity for an interconnect formed in a dielectric, with a first Ba—Cu alloy layer formed on a seed layer, and a first Cu—Ca—O film formed on the first Ba—Cu alloy layer, in accordance with a second embodiment of the present invention.

Next, as shown in FIG. 12 and as Step S1604 in FIG. 16, a Cu—Ba alloy layer 124 is formed over the seed layer 122. The Cu—Ba alloy layer 124 may be applied by electrodeposition. The Cu—Ba alloy layer 124 becomes an integral, chemically-reacted part of the superconductor material during subsequent annealing steps, as described more fully below.

In one embodiment, the Cu—Ba alloy layer 124 is deposited by electrodeposition. At the present time, electrodeposition (or electroplating) is considered the best mode of depositing the Cu—Ba alloy layer 124. In other embodiments, the Cu—Ba alloy layer 124 may be deposited by any of the techniques noted above for deposition of the seed layer 122. In one embodiment, the Cu—Ba alloy layer 124 is deposited directly onto the seed layer 122, with no intervening materials.

As noted above, the Cu—Ba alloy layer 124 may be deposited by electrodeposition. In one embodiment, the electrodeposition employs a pulsed waveform of the applied current as disclosed above. The use of pulsed waveform electrodeposition is known in the art. In one embodiment, the electrodeposition is applied using the electrolyte disclosed above for use in electrodeposition of the corresponding Cu—Ba layer 124 in the first embodiment. As noted above, the provided examples of components for the electrolyte are merely exemplary and are not intended to be either limiting or all-inclusive. Persons of skill in the art will know of many variations of these electrolyte solutions for electrodeposition.

Next, as shown in FIG. 12 and as Step S1605 in FIG. 16, a Cu—Ca—O film 126 is deposited onto the Cu—Ba alloy layer 124 in the second channel opening 104 and via opening 106. In one embodiment, the Cu—Ca—O film 126 is formed by electroless deposition. In another embodiment, the Cu—Ca—O film 126 is deposited by laser ablation, CVD or sputtering. In other embodiments, the Cu—Ca—O film 126 is deposited using other conventional metal deposition techniques, such as those identified above for deposition of the barrier layer 120.

In depositing the Cu—Ca—O film 126 onto the Cu—Ba alloy layer 124, which is in turn formed on the seed layer 122, as with each of the foregoing layers, the Cu—Ca—O film 126 forms a layer over the surface of the semiconductor device 100, as shown in FIG. 12. In one embodiment, the Cu—Ca—O film 126 is deposited directly onto the Cu—Ba alloy layer 124, with no intervening materials.

In one embodiment, the Cu—Ca—O film 126 is applied by an electroless plating method, from a solution such as any of those disclosed above with respect to deposition of the corresponding Cu—Ca—O film 126 in the first embodiment. As noted above, the provided examples of components for electroless plating are merely exemplary and are not intended to be either limiting or all-inclusive. Persons of skill in the art will know of many variations of these electroless plating solutions.

In an embodiment in which the superconductor comprises rhenium, Re, the rhenium may be added to the electrolyte for either electrodeposition or electroless deposition of the Cu—Ba alloy layer or the Cu—Ca—O film, in the form of a salt, e.g., ammonium perrhenate, $NH_4ReO_4$, or other suitable salt, an oxide, $Re_2O_7$, a fluoride, $ReF_6$, or an acid, $HReO_4$. If other methods of deposition are used for the Cu—Ba alloy layer or for the Cu—Ca—O film, Re may be added as appropriate.

Figure 13:
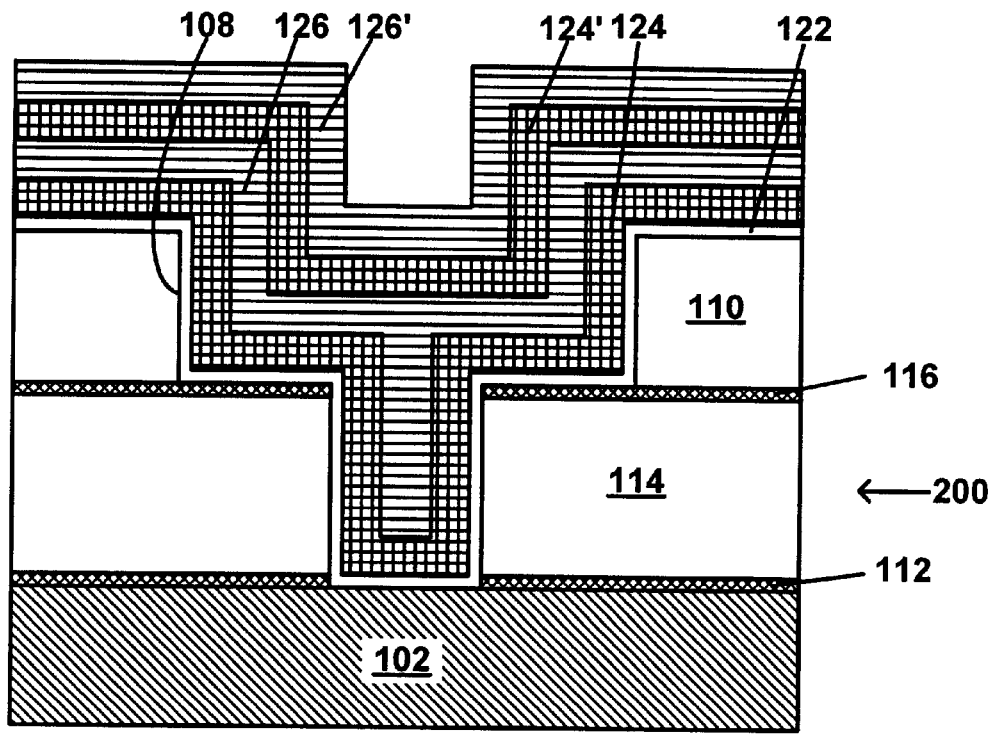
FIG. 13 is a partial cross-sectional view of a filled cavity for an interconnect formed in a dielectric, with a second Ba—Cu alloy layer formed on the first Cu—Ca—O film, and a second Cu—Ca—O film formed on the second Ba—Cu alloy layer, in accordance with the second embodiment of the present invention.

As disclosed above in relation to the first embodiment of the method, in this embodiment of the method, the Cu—Ca—O film 126 and the Cu—Ba alloy layer 124, as shown in FIG. 12, may be considered a "set" of alternating layers of these materials. The description of these layers disclosed above is the same for this embodiment, and is incorporated by reference as if fully disclosed here. FIG. 13 shows two sets of alternating layers of the Cu—Ca—O films 126 and 126' and the Cu—Ba alloy layers 124 and 124'. A sufficient number of sets should be applied to completely fill the cavity, at least to a level equal to or higher than the upper surface of the seed layer 122, which in this embodiment is considered to define the upper surface of the semiconductor device 100, for this purpose. A sufficient number of sets is applied so that when excess superconductor material is removed in subsequent steps, the resultant semiconductor device 100 can be provided with a flat, even surface, using the seed layer 122 as a stop layer. Thus, at the end of the process, the semiconductor device 200 shown in FIG. 3 will be obtained, in which the upper surface is substantially flat and smooth.

As indicated by the arrow from S1603 to Step S1605 in the flow diagram of FIG. 16, Steps S1604 and S1605 may be performed in reverse order, i.e., the step of applying the Cu—Ca—O film 126 may precede the step of applying the Cu—Ba alloy layer 124, immediately following the step of applying a seed layer. In this embodiment, the respective steps as described above are performed in reverse order following the step of applying a seed layer, with each step being the same as described above.

In one embodiment, the Cu—Ba alloy layer 124 is deposited to a thickness of about 5 nm to about 200 nm. In one embodiment, the Cu—Ba alloy layer 124 is deposited to a thickness of about 10 nm to about 100 nm. In another embodiment, the Cu—Ba alloy layer 124 is deposited to a thickness of about 20 nm to about 50 nm. The Cu—Ca—O film 126 may be deposited to similar thicknesses. In one embodiment, the thickness of each Cu—Ba alloy layer 124 and each Cu—Ca—O film 126 are the same in each set of alternating layers.

Figure 14:
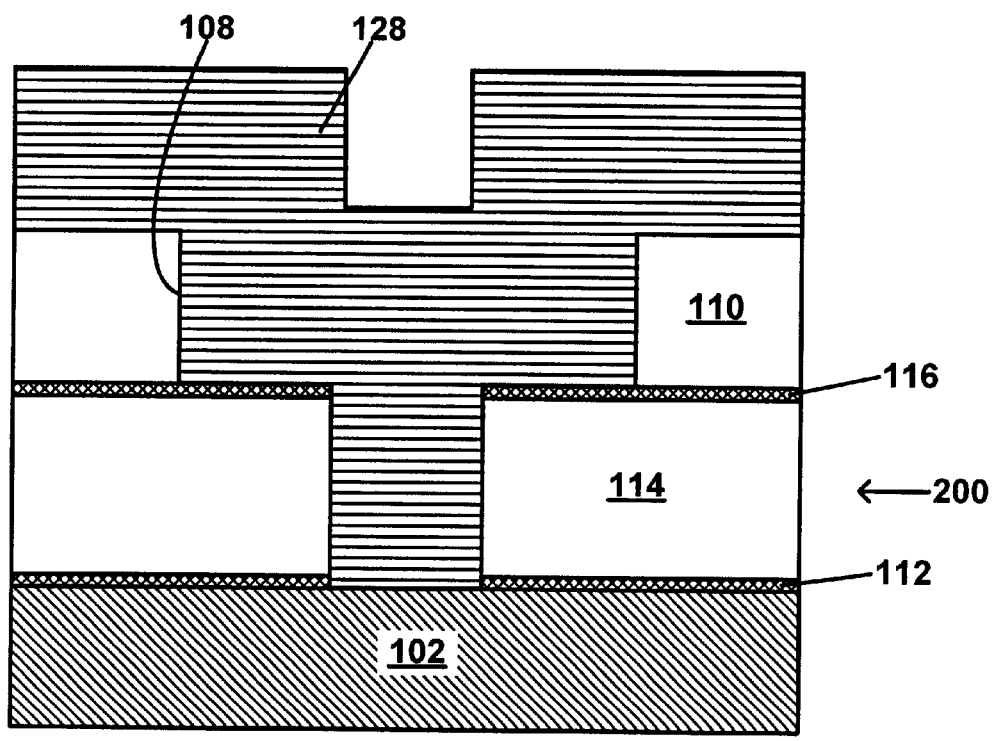
FIG. 14 is a partial cross-sectional view of a filled cavity for an interconnect, following an annealing step, with the cavity filled with a superconductor, in accordance with the second embodiment of the present invention.

As shown in FIG. 14 and as Step S1606 in FIG. 16, with the at least one set of the Cu—Ca—O film 126 and the Ba—Cu alloy layer 124 in place and filling the second channel 104 and the via 106, the semiconductor device 100 as shown in FIG. 13 is subjected to annealing in an oxygen flow. The step of annealing in an oxygen flow forms a Ba—Cu—Ca—O superconducting material 128 from the layers of the Ba—Cu alloy layer 124, the Cu—Ca—O film 126 and at least a portion of the seed layer 122, as shown in FIG. 14.

The annealing step is carried out in an oxygen flow, in which the oxygen may be provided as ozone, $O_3$, or as oxygen, $O_2$. The ozone may be generated in situ, or provided from an external source. Singlet oxygen may be included. The annealing conditions are the same for this embodiment as for the first embodiment, and are incorporated by reference.

The step of annealing in an oxygen flow (Step S1606) converts the Ba—Cu alloy layer 124, the Cu—Ca—O film 126 and at least a portion of the seed layer 122 into the Ba—Cu—Ca—O superconducting material 128 shown in FIG. 14. In the annealing step, the oxygen provided by the oxygen flow reacts with the Cu—Ca—O film layer 126, the Ba—Cu alloy 124 and the seed layer 122, to form the Ba—Cu—Ca—O superconducting material 128, shown in FIG. 14. In one embodiment, the Ba—Cu—Ca—O superconducting material has a formula $Ba_2Cu_xCa_{x-1}O_{2x+3}$, wherein x is in the range from greater than 1 to about 6. In one embodiment, x is in the range from about 2 to about 5, in another from about 3 to about 4. In one embodiment, x=3, and in another embodiment, x=4.

FIG. 14 shows an embodiment in which the step of annealing in an oxygen flow converts the Ba—Cu alloy layer 124, the Cu—Ca—O film 126 and substantially all of the seed layer 122 into a Ba—Cu—Ca—O superconducting material 126. In an alternative embodiment, not shown with respect to the present embodiment, but substantially similar to that shown in FIG. 10 of the previous embodiment, the step of annealing in an oxygen flow converts the Ba—Cu alloy layer 124, the Cu—Ca—O film 126 and only a portion of the seed layer 122 into a Ba—Cu—Ca—O superconducting material 128. As a result, a thin seed layer 122 remains between the superconductor material 128 and the barrier layer 120. While the embodiment shown in FIG. 13 is generally preferred, the alternate embodiment in which a portion of the seed layer 122 remains is within the scope of the present invention, and may be preferred for some purposes.

Thereafter, a chemical mechanical polishing or other suitable etching and surfacing process is used to complete the process by removing excess superconductor material 128 from the upper surface of the semiconductor wafer 200, to obtain the semiconductor device shown in FIG. 3, in which the Ba—Cu—Ca—O superconducting material 128 forms the second channel 104, and in which no barrier layer is included.

Figure 17:
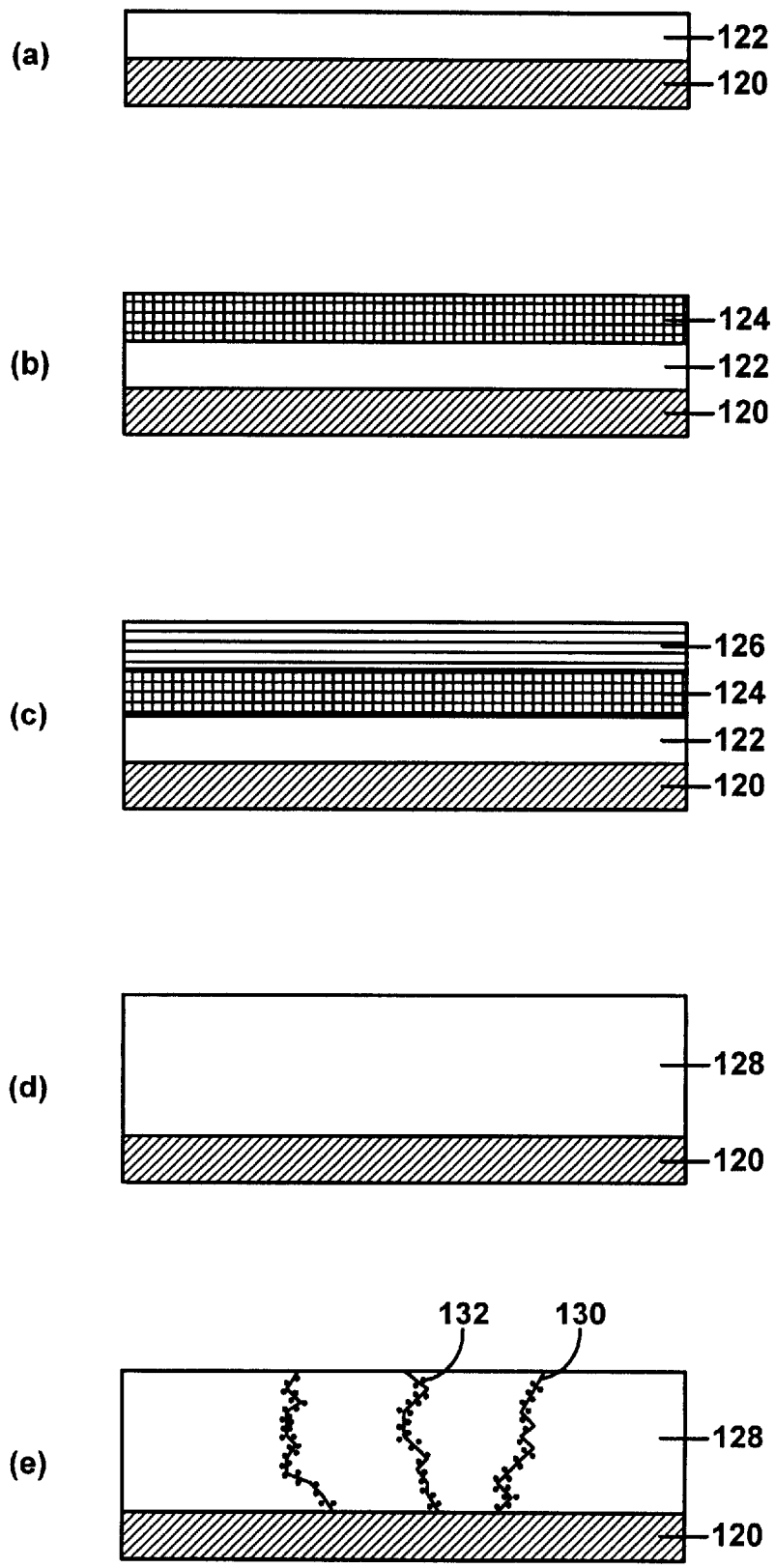
FIG. 17 is a simplified partial cross-sectional view of layers of one embodiment of the present invention.

Referring to FIG. 17, therein is shown a simplified partial cross-sectional view of layers of one embodiment of the present invention. FIG. 17 is briefly described in the following with reference to the process shown in FIG. 15, beginning with the barrier layer 120 and the seed layer 122 already in place, shown in (a) of FIG. 17. As will be understood, although not explicitly set forth herein, a similar description would apply to the embodiment of the method shown in FIG. 16.

In (b) of FIG. 17, a layer of Cu—Ba alloy layer 124 is shown, formed on the seed layer 122. The Cu—Ba alloy layer 124 was added by Step S1505.

In (c) of FIG. 17, a Cu—Ca—O film 126 is shown, formed on the Cu—Ba alloy layer 124. The Cu—Ca—O film 126 was added by Step S1506. As noted above, Re may be added with the Cu—Ca—O film 126, or with the Cu—Ba alloy layer 124.

In (d) of FIG. 17, a Ba—Cu—Ca—O superconductor 128 is shown, formed from the seed layer 122, the Cu—Ba alloy layer 124 and the Cu—Ca—O layer 126, by the Step S1507, annealing in an oxygen flow.

In (e) of FIG. 17, the Ba—Cu—Ca—O superconductor 128 is shown in more detail. As shown in FIG. 17(e), the Ba—Cu—Ca—O superconductor 128 actually comprises many crystals of the Ba—Cu—Ca—O superconducting material, i.e., the Ba—Cu—Ca—O superconducting material is polycrystalline. In FIG. 17(e), the crystals of the Ba—Cu—Ca—O superconducting material are separated by grain boundaries 130. Atoms 132 of calcium which have migrated near the grain boundaries 130 are shown in FIG. 17(e).

While the invention is not to be limited by theory, it is believed that the calcium, Ca, shown as the atoms 132 in FIG. 17(e), in the Ba—Cu—Ca—O superconductor material facilitates superconductivity by migrating from the Ca-doped internal portions of the crystals to the grain boundaries 130, and that the atoms 132 of calcium act to bridge or plug the gaps between the individual crystals of superconducting material, and thereby the atoms 132 of calcium enhance the superconductivity.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming a superconducting damascene interconnect structure, comprising:

forming a cavity in an interlevel dielectric;

forming a barrier layer in the cavity;

forming a seed layer in the cavity over the barrier layer;

forming a Cu—Ba alloy layer;

filling the cavity by depositing a Cu—Ca—O film; and annealing in oxygen flow to form a Ba—Cu—Ca—O superconductor on the barrier layer.

2. The method of claim 1, wherein the barrier layer comprises one or more of Ta, TaN, TaSiN, TiSiN, WN, Co, Ni, Pd, Mo, W, NiW, NiTa, NiMo, CoW, CoTa, CoMo, PdW, PdTa, and PdMo.

3. The method of claim 2, wherein the barrier layer is formed by CVD, PVD, HCM, electroless, electroplating, IMP, sputtering, or ALD.

4. The method of claim 1, wherein the seed layer is formed of Cu, a Cu—Ag alloy or Ag.

5. The method of claim 4, wherein the seed layer is formed by electrodeposition or by electroless deposition.

6. The method of claim 1, wherein the Cu—Ba layer is formed by electrodeposition with a pulsed waveform current.

7. The method of claim 1, wherein the step of annealing forms the Ba—Cu—Ca—O superconductor from the seed layer, the Cu—Ba layer and the Cu—Ca—O layer.

8. The method of claim 1, wherein the Cu—Ca—O layer is formed by electrodeposition or by electroless deposition.

9. The method of claim 1, wherein at least one of the Cu—Ba alloy and the Cu—Ca—O film further comprises Re.

10. The method of claim 9, wherein the Re is added to an electrochemical solution from which the alloy or film is deposited.

11. The method of claim 1, wherein the Ba—Cu—Ca—O superconductor has a formula $Ba_2Cu_xCa_{x-1}O_{2x+3}$, wherein x is in the range from greater than 1 to about 6.

12. The method of claim 1, wherein the Ba—Cu—Ca—O superconductor has a Tc of at least about 126° K.

13. A method of forming a superconducting damascene interconnect structure, comprising:

forming a cavity in an interlevel dielectric;

forming a seed layer in the cavity;

forming a Cu—Ba alloy layer;

filling the cavity by depositing a Cu—Ca—O film; and annealing in oxygen flow to form a Ba—Cu—Ca—O superconductor on the interlevel dielectric.

14. The method of claim 13, wherein the Cu—Ba layer is formed by electrodeposition with a pulsed waveform current.

15. The method of claim 13, wherein the Cu—Ca—O layer is formed by electrodeposition or by electroless deposition.

16. The method of claim 13, wherein at least one of the Cu—Ba alloy and the Cu—Ca—O film further comprises Re.

17. The method of claim 13, wherein the Ba—Cu—Ca—O superconductor has a formula $Ba_2Cu_xCa_{x-1}O_{2x+3}$, wherein x is in the range from greater than 1 to about 6.

18. The method of claim 13, wherein the Ba—Cu—Ca—O superconductor has a Tc of at least about 126° K.

19. The method of claim 13, wherein the seed layer is formed of Cu, a Cu—Ag alloy or Ag.

20. The method of claim 19, wherein the seed layer is formed by electrodeposition or by electroless deposition.

21. The method of claim 13, wherein the step of annealing forms the Ba—Cu—Ca—O superconductor from the seed layer, the Cu—Ba layer and the Cu—Ca—O layer.

* * * * *